United States Patent
Murata et al.

[11] Patent Number: 6,123,464
[45] Date of Patent: Sep. 26, 2000

[54] OPTICAL MODULE PACKAGE AND METHOD FOR MANUFACTURING THE SAME

[75] Inventors: Hideaki Murata, Kanagawa; Takeshi Aikiyo, Chiba; Kazuto Ono, Tochigi; Masato Sakata, Tochigi; Yukio Kazama, Tochigi, all of Japan

[73] Assignee: The Furukawa Electric Co., Ltd., Tokyo, Japan

[21] Appl. No.: 09/247,364

[22] Filed: Feb. 10, 1999

[51] Int. Cl.⁷ ..................................................... G02B 6/36
[52] U.S. Cl. .................. 385/92; 385/88; 385/94
[58] Field of Search ................... 385/92, 88–94

[56] References Cited

U.S. PATENT DOCUMENTS

| | | | |
|---|---|---|---|
| 5,430,820 | 7/1995 | Van Tongeren et al. | 385/94 |
| 5,513,198 | 4/1996 | Jakobson | 372/43 |
| 5,661,835 | 8/1997 | Kato et al. | 385/92 |
| 5,770,473 | 6/1998 | Hall et al. | 438/26 |
| 5,812,716 | 9/1998 | Ohishi | 385/92 |
| 6,056,447 | 5/2000 | Caras | 385/92 |

FOREIGN PATENT DOCUMENTS 0 720 260A1  7/1996  European Pat. Off. .

*Primary Examiner*—Phan T. H. Palmer
*Attorney, Agent, or Firm*—Frishauf, Holtz, Goodman, Langer & Chick, P.C.

[57] ABSTRACT

A method of manufacturing an optical module package, which comprises the steps of, attaching a first member to a frame by means of silver-brazing to obtain a frame structure, applying an Au plating to the frame structure applied with the silver-brazing, and soldering a second member to the frame structure applied with the Au plating, wherein the method further comprises the steps of subjecting the frame structure to a high temperature dehydrogenation treatment of heating the frame structure in an non-oxidizing atmosphere at a temperature of 340° C. or more for 10 minutes or more after the silver-brazing step and before the Au plating step, and subjecting the frame structure to a low temperature dehydrogenation treatment of heating the frame structure in an non-oxidizing atmosphere at a temperature ranging from 240° C. to 260° C. for 5 minutes or more after the soldering step.

9 Claims, 1 Drawing Sheet

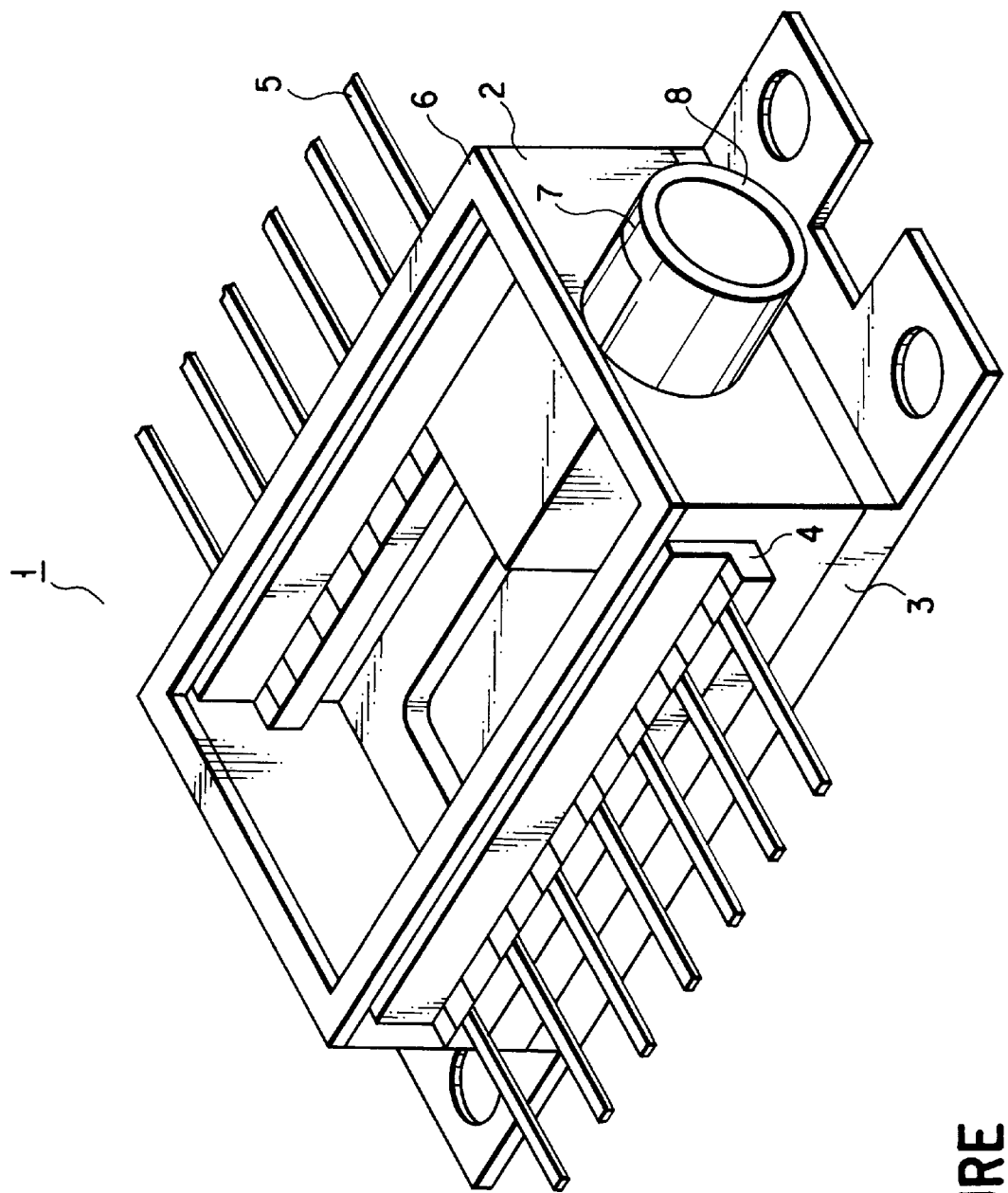
FIGURE

OPTICAL MODULE PACKAGE AND METHOD FOR MANUFACTURING THE SAME

BACKGROUND OF THE INVENTION

This invention relates to an optical module package which is suited for use in packaging therein a laser diode for optical communication, in particular to be employed as an exciting light source of light direct amplification type emitting a wavelength of 0.98 μm.

As shown in FIGURE, an optical module package 1 comprises a heat spreader attached through silver-brazing to the bottom of a frame 2, ceramic terminals 4 and leads 5 which are attached through silver-brazing to the side walls of the frame 2, and a seal ring 6 attached through silver-brazing to the top of the frame 2. This resultant silver-brazed structure is then subjected to an Au-plating, and thereafter a window (not shown) is attached by means of AuSn soldering to the rear end portion of a window frame 7 which is disposed at the front portion of the Au-plated frame 2. By the way, when an Au-plating is to be performed, an Ni-plating is generally applied as an underplating before the Au-plating.

After a laser diode (not shown), etc. are mounted on a predetermined inner portion of the optical module package 1 constructed in this manner, a cover (not shown) is seam-welded on the seal ring 6 attached to the top of the frame 2, thereby assembling an optical module.

Next, the constituent parts of the optical module package will be explained with reference to FIGURE.

The heat spreader 3 constitutes the bottom portion of the optical module package 1. This heat spreader 3 is made of a high heat conductive material, e.g. a CuW board whose surface is plated with Ni, thus rendering it to function as a medium for easily releasing the heat generated during the operation of the optical module into the external atmosphere.

The frame 2 constitutes the outer framework of the optical module package 1, and can be manufactured by means of an injection molding using an Fe—Ni—Co alloy (Kovar) or an Fe—Ni alloy. The window frame 7 can be molded integral with the main frame body by means of injection molding. This frame 2 can be manufactured also by a method wherein a square pipe is cut out at first thereby to form a main body to which a pipe functioning as the window frame 7 is soldered.

The ceramic terminals 4 can be attached to the side walls of the frame 2 by means of silver-brazing. As for the material for constituting the ceramic terminals 4, a multi-layer ceramic which is composed of plural alumina thin plates laminated with each other can be employed. This multi-layer ceramic can be manufactured by means of an ordinary sintering method. The lead connecting portion (electrode portion) of the ceramic terminals 4 is subjected to an Ni-plating after the metallization treatment thereof.

The leads 5 are a conductor medium electrically connecting the electric parts mounted inside the package with the external power source. The seal ring 6 is a counterpart part for seam-welding the cover, and may be formed of Kovar or an FeNi alloy. These leads 5 and seal ring 6 can be manufactured by means of etching or press-punching.

The window can be manufactured by a process wherein a sapphire body constituting the window is metallized at first and then covered thereon with a non-reflection coating.

Next, the method of manufacturing an optical module package using the aforementioned parts will be explained in details with reference to FIGURE.

First of all, the frame 2 is disposed via a silver braze on the surface of the heat spreader 3, the ceramic terminals 4 and the leads 5 are both disposed via a silver braze to contact with the side walls of the frame 2, and the seal ring 6 is disposed via a silver braze on the upper surface of the frame 2, respectively. Then, while each member is being retained in position by making use of a carbon jig, the resultant structure is heated in a mixed gas atmosphere containing hydrogen (hereinafter referred to simply as a hydrogen-containing atmosphere) thereby to perform the silver brazing thereof.

The entire structure thus brazed with this silver braze is subjected to an Au plating. Any portions of the structure which may cause an inconvenience due to the existence of this Au plating such as the front end face 8 of the window frame to which the bracket of an optical fiber is to be attached should be polished in advance so as to remove the Au plating. Thereafter, the window is attached by means of soldering to the rear end portion of the window frame 7 which has been mounted on the front portion of the frame. This soldering is performed using an AuSn solder and in a hydrogen-containing atmosphere.

Since the silver brazing and the soldering of the window using an AuSn solder are all performed in a hydrogen-containing atmosphere according to the aforementioned manufacturing method of an optical module package, it is inevitable that a large quantity of hydrogen is absorbed in the parts made of Kovar or FeNi alloy, and that a large quantity of hydrogen is absorbed in the Au-plating layer during the plating process. It is also inevitable that a large quantity of hydrogen gas is absorbed in advance in the parts made of Kovar or FeNi alloy, since the heat treatment at the occasion of working of raw materials as well as the sintering of molded products after the injection molding thereof are all performed in a hydrogen-containing atmosphere.

The hydrogen gas absorbed in the parts made of Kovar or FeNi alloy, or in the Au-plating layer is caused to be released gradually due to the heat generated at the occasion of seam-welding the cover to the frame or due to the heat generated in the operation of the optical module. As a result, the hydrogen gas thus released is caused to react with the oxygen gas included in a very small quantity inside the package, thus producing water. When this package is exposed to a low temperature, this produced water is caused to condense in the package thereby to form dew drops, thus badly affecting the operation of the optical module and deteriorating the reliability of the optical module.

In view of these problems, a method has been proposed (Japanese Patent Unexamined Publication No. H7-147457) wherein the package is subjected, after the soldering of the window, to a heating treatment in the air atmosphere or nitrogen gas atmosphere at a temperature of 150° C. for 200 hours or so, thereby allowing the absorbed hydrogen to be released from the package.

However, this method is accompanied with the problems that since the heating time is relatively long, the productivity may be deteriorated, and that the front end face portion of the window frame where the Au plating has been removed in advance is oxidized thereby inviting the discoloration thereof, thus making it difficult to satisfactorily perform the subsequent spot welding of the fixing bracket of an optical fiber.

It is also conceivable, as a method for overcoming the aforementioned problems, to anneal the package at a high temperature and for a short time in vacuum or in an inert gas atmosphere. However, this method is unpractical, since it will invite the melting of the AuSn soldering which is low in melting point as well as the denaturing of the Au plating layer due to the diffusion thereof.

BRIEF SUMMARY OF THE INVENTION

Therefore, the object of the present invention is to provide an optical module package, which makes it possible to obtain an optical module which is low in quantity of hydrogen absorption and is excellent in reliability.

Another object of the present invention is to provide a method of manufacturing an optical module package, which makes it possible to obtain an optical module which is low in quantity of hydrogen absorption and is excellent in reliability.

Namely, according to this invention, there is provided an optical module package, which comprises a frame; a heat spreader attached through silver-brazing to a bottom of the frame; a ceramic terminal and a lead which are attached through silver-brazing to side walls of the frame; and a seal ring attached through silver-brazing to an upper portion of the frame; wherein the quantity of hydrogen gas to be released from the package under a condition wherein the package is subjected to a second heating at a temperature of 250°0 C. for 30 minutes after the package is subjected to a first heating at a temperature of 100° C. for 30 minutes is $1.0 \times 10^{-10}$ L(liter)/mm$^2$ or less.

According to this invention, there is also provided a method of manufacturing an optical module package, which comprises the steps of: attaching a first member to a frame by means of silver-brazing to obtain a frame structure; applying an Au plating to the frame structure applied with the silver-brazing; and soldering a second member to the frame structure applied with the Au plating; wherein the method further comprises the steps of: subjecting the frame structure to a high temperature dehydrogenation treatment of heating the frame structure in a non-oxidizing atmosphere at a temperature of 340° C. or more for 10 minutes or more after the silver-brazing step and before the Au plating step; and subjecting the frame structure to a low temperature dehydrogenation treatment of heating the frame structure in an non-oxidizing atmosphere at a temperature ranging from 240° C. to 260° C. for 5 minutes or more after the soldering step.

According to this invention, there is further provided a method of manufacturing an optical module package, which comprises the steps of: attaching a first member to a frame by means of silver-brazing to obtain a frame structure; applying an Au plating to the frame structure applied with the silver-brazing; and soldering a second member to the frame structure applied with the Au plating; wherein the method further comprises the steps of: subjecting the frame structure to a high temperature dehydrogenation treatment of heating the frame structure in an non-oxidizing atmosphere at a temperature of 340° C. or more for 10 minutes or more after the Au plating step and before the soldering step; and subjecting the frame structure to a low temperature dehydrogenation treatment of heating the frame structure in an non-oxidizing atmosphere at a temperature ranging from 240° C. to 260° C. for 5 minutes or more after the soldering step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

The single FIGURE is a perspective view schematically illustrating an optical module package.

DETAILED DESCRIPTION OF THE INVENTION

The optical module package according to this invention in featured in that the quantity of hydrogen gas to be released from said package under a condition wherein said package is subjected to a main heating (a second heating) at a temperature of 250° C. for 30 minutes after said package is subjected to a preliminary heating (a first heating) at a temperature of 100° C. for 30 minutes is $1.0 \times 10^{-10}$ L/mm$^2$ or less. Since the optical module package according to this invention is minimal in the quantity of hydrogen absorption, it is possible to obviate the formation of dew drops at the occasion of seam-welding the cover or in the operation of the optical module, thus making it possible to obtain an optical module of high reliability.

The reason for measuring the quantity of hydrogen absorption in the package under a heating condition of 250° C. for 30 minutes in the optical module package of this invention is based on the fact that under this condition, most of the absorbed hydrogen can be released from the package, so that if the quantity of gas released is small, i.e. $1.0 \times 10^{-10}$ L/mm$^2$ or less, there is little possibility of generating dew drops in the package at the occasion of seam-welding the cover or in the operation of the optical module, thus making it possible to prevent the function of the optical module from being deteriorated.

The reason for performing the pre-heating at a temperature of 100° C. for 30 minutes prior to the main heating is to remove various gases adsorbed on the surface of the package, thereby enhancing the precision of the analysis of the absorbed hydrogen.

A first method of manufacturing an optical module package according to this invention is featured in that the dehydrogenation treatment is performed in two steps, i.e. after the step of silver-brazing and after the steps of Au-plating and the soldering of the window, thereby shortening the treatment time required for the dehydrogenation.

Namely, since the melting point of the silver braze is relatively high, the dehydrogenation treatment after the silver brazing can be performed at a relatively high temperature, thus making it possible to shorten the dehydrogenation treatment time.

Since the Au plating layer can be easily denatured due to the diffusion thereof and since the AuSn solder is relatively low in melting point, the dehydrogenation treatment after the steps of Au-plating and the soldering of the window is performed at a relatively low temperature. At the occasion of Au-plating step however, the hydrogen is absorbed in the Au plating layer. Further, since the step of AuSn soldering is performed in a hydrogen-containing atmosphere with the treatment temperature thereof being maintained at a low temperature of about 300° C. (the melting point of the AuSn soldering is 278° C.) for several minutes, hydrogen is also absorbed in the AuSn solder. Although the hydrogen absorption in both cases takes place in the vicinity of the surfaces of these layers, the dehydrogenation can be sufficiently achieved even if the treatment temperature is relatively low and the treatment time is relatively short.

The reason for performing the high temperature dehydrogenation treatment at a temperature of 340° C. or more in the first method of this invention is based on the fact that if the treatment temperature is less than 340° C., it is impossible to achieve a sufficient dehydrogenation, thus taking a long time for the treatment and hence lowing the productivity. Although the upper limit of the temperature for this high temperature dehydrogenation treatment is not defined here, the upper limit of temperature is of course required to be not higher than the melting point of the parts or of the silver braze.

For example, when BAg-8 (JIS-Z3261-85) is to be employed, the upper limit of the treatment temperature should be set to 780° C. or less. The dehydrogenation can be achieved without raising any practical problem even if the treatment time is 10 minutes or so. Since the quantity of dehydrogenation would be saturated even if the treatment time is elongated any further, thus deteriorating the productivity. Therefore, the upper limit of the treatment time would preferably be 300 minutes.

A second method of manufacturing an optical module package according to this invention is featured in that the high temperature dehydrogenation treatment is performed after the step of Au-plating. The reason for performing the high temperature dehydrogenation treatment at a temperature ranging from 340° C. to 500° C. in this method is based on the fact that if the treatment temperature is less than 340° C., it is impossible to achieve a sufficient dehydrogenation, thus taking a long time for the treatment and hence lowing the productivity. On the other hand, if the treatment temperature is higher than 500° C., the Au plating may be diffused into the underlying Ni plating or into the mother material, thus deteriorating the solderability or the corrosion resistance of the package.

The reason for performing the high temperature dehydrogenation treatment in a non-oxidizing atmosphere is based on the fact that if the treatment is performed in an oxidizing atmosphere, the surface of the package may be oxidized or denatured, thus making it impossible to satisfactorily perform the subsequent AuSn sealing step.

The reason for performing the low temperature dehydrogenation treatment at a temperature ranging from 240° C. to 260° C. is based on the fact that if the treatment temperature is less than 240° C., it is impossible to achieve a sufficient dehydrogenation, thus taking a long time for the treatment and hence lowing the productivity. On the other hand, if the treatment temperature is higher than 260° C., the AuSn solder may begin to melt. The dehydrogenation can be achieved without raising any practical problem even if the treatment time is 5 minutes or so. Since the quantity of dehydrogenation would be saturated even if the treatment time is elongated any further, thus deteriorating the productivity. Therefore, the upper limit of the treatment time would preferably be 300 minutes.

The reason for performing the low temperature dehydrogenation treatment in a non-oxidizing atmosphere is based on the fact that if the treatment is performed in an oxidizing atmosphere, the front end face of the window frame where the Au plating has been removed in advance may be oxidized or discolored, thus making it difficult to satisfactorily perform the subsequent spot welding of the fixing bracket of an optical fiber.

This low temperature dehydrogenation treatment may be performed not only subsequent to the step of the Au plating but also subsequent to the step of soldering the window.

As for the non-oxidizing atmosphere for performing the dehydrogenation treatment, various atmosphere such as vacuum, argon gas, nitrogen gas, etc. may be employed in both high and low temperature dehydrogenation treatments.

The optical module package of this invention would exhibit more prominent effect when it is employed, while being filled therein with an inert gas containing a very small quantity of oxygen, for mounting a laser diode to be employed as an exciting light source of light direct amplification type emitting a wavelength of 0.98 $\mu$m.

The metal injection molded parts constituting the optical package are designed to be sintered in a hydrogen-containing atmosphere, and hence a large quantity of hydrogen is absorbed by these metal injection molded parts. Therefore, this invention is very effective when the optical module package is designed to be constituted by these metal injection molded parts.

Next, this invention will be further explained in details with reference to the following specific examples.

EXAMPLE 1

A heat spreader was attached through silver-brazing to the bottom of a frame. Ceramic terminals and leads were also attached through silver-brazing to the side walls of the frame. Thereafter, a seal ring was attached through silver-brazing to the top of the frame. This resultant silver-brazed structure was then subjected to a high temperature dehydrogenation treatment under the conditions (Nos. 1 and 2) indicated in the following Table. The resultant silver-brazed structure undergone with this high temperature dehydrogenation treatment was then entirely subjected to an Au-plating. Then, a portion of the Au-plating which was deposited on the front end face portion of a window frame was removed by means of polishing. Thereafter, a window was attached by means of soldering to the rear end portion of the window frame which was disposed at the front portion of the Au-plated frame. The resultant silver-brazed structure was then subjected to a low temperature dehydrogenation treatment under the conditions (Nos. 1 and 2) indicated in the following Table.

The frame employed in this example was a metal injection mold product provided integrally with the window frame. BAg-B alloy was employed for the silver braze. The silver brazing and the AuSn soldering were performed using a belt type continuous electric furnace. A batch type electric furnace was employed in both high and low temperature dehydrogenation treatments. Both high and low temperature dehydrogenation treatments were variously altered.

EXAMPLE 2

A heat spreader was attached through silver-brazing to the bottom of a frame. Ceramic terminals and leads were also attached through silver-brazing to the side walls of the frame. Thereafter, a seal ring was attached through silver-brazing to the top of the frame. This resultant silver-brazed structure was then entirely subjected to an Au-plating. After a portion of the Au-plating which was deposited on the front end face portion of a window frame was removed by means of polishing, the resultant structure was subjected to a high temperature dehydrogenation treatment under the conditions (No. 3) indicated in the following Table. Thereafter, a window was attached by means of soldering to the rear end portion of the window frame which was disposed at the front portion of the Au-plated frame. The resultant structure was then subjected to a low temperature dehydrogenation treatment under the conditions (No. 3) indicated in the following Table.

The frame employed also in this example was a metal injection mold product provided integrally with the window frame. BAg-B alloy was employed for the silver braze. The silver brazing and the AuSn soldering were performed using a belt type continuous electric furnace. A batch type electric furnace was employed in both high and low temperature dehydrogenation treatments.

Then, each of the optical module packages thus obtained was measured with respect to the quantity of hydrogen absorbed by these optical module packages.

This measurement was performed by making use of a mass spectrometer and measuring the quantity of hydrogen released in a main heating which was conducted under a condition wherein the package is subjected to the main heating at a temperature of 250° C. for 30 minutes after the package was subjected in advance to a preliminary heating at a temperature of 100° C. for 30 minutes.

Further, for the purpose of comparison, other samples were prepared by seam-welding a cover to a package, and by filling the package with a nitrogen gas mixture containing 20% of oxygen gas. Then, the resultant packages were kept at a temperature of 100° C. for 500 hours, and the water existing inside the package was measured by making use of a mass spectrometry type gas analyzer. The quantity of absorbed hydrogen and the water content (vol. %) in the packages thus measured are shown in the following Table.

front end face of the window frame was also recognized. In the case of No. 5, although the dehydrogenation treatment temperature was increased up to the neighborhood of the melting point of the AuSn solder, it was still impossible to achieve a sufficient dehydrogenation.

As explained above, since the quantity of hydrogen absorption is low in the case of the optical module package according to this invention, there is a little possibility of generating dew drops during the operation of the optical module, thus making it possible to obtain an optical module package of high reliability. Further, in the method of manufacturing an optical module package according to this invention, since the dehydrogenation treatment is performed in two steps, i.e. a high temperature dehydrogenation treatment to be performed in the first half of the manufacturing process and a low temperature dehydrogenation treatment to be performed in the latter half of the manufacturing process, it is possible to perform a sufficient dehydrogenation and to achieve a markedly shortened dehydrogenation treatment time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical module package which comprises;
   a frame;
   a heat spreader attached through silver-brazing to a bottom of said frame;

TABLE

|  | No. | High temperature dehydrogenation treatment | Low temperature dehydrogenation treatment | Absorbed hydrogen (L/mm$^2$) | Water in filling gas (vol. %) |
| --- | --- | --- | --- | --- | --- |
| Example 1 | 1 | Vacuum 340° C. 10 min. | Vacuum 240° C. 5 min. | $1.0 \times 10^{-10}$ or less | 0.1 or less |
|  | 2 | Vacuum 650° C. 300 min. | Vacuum 250° C. 300 min. | $1.0 \times 10^{-10}$ or less | 0.1 or less |
| Example 2 | 3 | Vacuum 340° C. 10 min. | Vacuum 240° C. 5 min. | $1.0 \times 10^{-10}$ or less | 0.1 or less |
| Comparative example | 4 | none | Air atmosphere 150° C. 200 hr. | $2.2 \times 10^{-10}$ | 0.34 |
|  | 5 | none | Vacuum 275° C. 300 min. | $4.1 \times 10^{-10}$ | 0.36 |

As apparent from this Table, the quantity of hydrogen absorbed by the packages of Nos. 1 to 3 according to this invention was all found as being as small as $1.0 \times 10^{-10}$ L(liter)/mm$^2$ or less, and the water content inside the packages was also found as being as small as 0.1 vol. %. Furthermore, it was possible to achieve a sufficient dehydrogenation within a short period of time, i.e. taking only 15 minutes in total of the high and low dehydrogenation treatments in some samples indicating the shortest treatment time.

On the other hand, the comparative example No. 4 representing a conventional method (Japanese Patent Unexamined Publication No. H7-147457) was incapable of achieving a sufficient dehydrogenation even if the treatment time was extended up to 200 hours in view of the low dehydrogenation treatment temperature. Additionally, this comparative example No. 4 indicated a large content of water. Moreover, since the dehydrogenation treatment was performed in the air atmosphere, the discoloration of the a ceramic terminal and a lead which are attached through silver-brazing to side walls of said frame; and
a seal ring attached through silver-brazing to an upper portion of said frame;
wherein the quantity of hydrogen gas to be released from said package under a condition wherein said package is subjected to a second heating at a temperature of 250° C. for 30 minutes after said package is subjected to a first heating at a temperature of 100° C. for 30 minutes is $1.0 \times 10^{-10}$ L(liter)/mm$^2$ or less.

2. A method of manufacturing an optical module package, which comprises the steps of:
   attaching a first member to a frame by means of silver-brazing to obtain a frame structure;
   applying an Au plating to said frame structure applied with said silver-brazing; and
   soldering a second member to said frame structure applied with said Au plating;

wherein said method further comprises the steps of:
subjecting said frame structure to a high temperature dehydrogenation treatment of heating said frame structure in an non-oxidizing atmosphere at a temperature of 340° C. or more for 10 minutes or more after said silver-brazing step and before said Au plating step; and
subjecting said frame structure to a low temperature dehydrogenation treatment of heating said frame structure in an non-oxidizing atmosphere at a temperature ranging from 240° C. to 260° C. for 5 minutes or more after said soldering step.

3. The method according to claim 2, wherein said first member represents a heat spreader to be attached to a bottom of said frame, ceramic terminals and leads which are to be attached to side walls of said frame, and a seal ring to be attached to a top of said frame.

4. The method according to claim 2, wherein said non-oxidizing atmosphere is an atmosphere selected from the group consisting of a vacuum atmosphere, an argon gas atmosphere and a nitrogen gas atmosphere.

5. The method according to claim 2, wherein said high temperature dehydrogenation treatment is performed at a temperature which is incapable of melting said silver braze.

6. The method according to claim 2, which further comprises a step of low temperature dehydrogenation treatment which is performed in an non-oxidizing atmosphere at a temperature ranging from 240° C. to 260° C. for 5 minutes or more after said Au plating step and before said soldering step.

7. A method of manufacturing an optical module package, which comprises the steps of:
attaching a first member to a frame by means of silver-brazing to obtain a frame structure;
applying an Au plating to said frame structure applied with said silver-brazing; and
soldering a second member to said frame structure applied with said Au plating;
wherein said method further comprises the steps of:
subjecting said frame structure to a high temperature dehydrogenation treatment of heating said frame structure in an non-oxidizing atmosphere at a temperature of 340° C. or more for 10 minutes or more after said Au plating step and before said soldering step; and
subjecting said frame structure to a low temperature dehydrogenation treatment of heating said frame structure in an non-oxidizing atmosphere at a temperature ranging from 240° C. to 260° C. for 5 minutes or more after said soldering step.

8. The method according to claim 7, wherein said first member represents a heat spreader to be attached to a bottom of said frame, ceramic terminals and leads which are to be attached to side walls of said frame, and a seal ring to be attached to a top of said frame.

9. The method according to claim 7, wherein said non-oxidizing atmosphere is an atmosphere selected from the group consisting of a vacuum atmosphere, an argon gas atmosphere and a nitrogen gas atmosphere.

* * * * *